United States Patent
Stan et al.

(10) Patent No.: US 6,710,627 B2
(45) Date of Patent: Mar. 23, 2004

(54) DYNAMIC CMOS CIRCUITS WITH INDIVIDUALLY ADJUSTABLE NOISE IMMUNITY

(75) Inventors: Mircea R. Stan, Charlottesville, VA (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/322,934

(22) Filed: Dec. 18, 2002

(65) Prior Publication Data
US 2003/0122580 A1 Jul. 3, 2003

Related U.S. Application Data

(62) Division of application No. 09/607,495, filed on Jun. 30, 2000, now Pat. No. 6,518,796.

(51) Int. Cl.[7] ............................................. H03K 19/096
(52) U.S. Cl. ............................ 326/95; 326/23; 326/121
(58) Field of Search ............................ 326/93–98, 112, 326/119, 121

(56) References Cited

U.S. PATENT DOCUMENTS

| | | | |
|---|---|---|---|
| 5,532,622 A | 7/1996 | Beiley et al. ................. | 326/95 |
| 5,793,228 A | 8/1998 | Evans ........................... | 326/98 |
| 5,841,300 A | 11/1998 | Murabayashi et al. ........ | 326/98 |
| 6,060,909 A | * 5/2000 | Aipperspach et al. ......... | 326/98 |
| 6,094,072 A | * 7/2000 | Davies et al. ................. | 326/98 |
| 6,188,247 B1 | * 2/2001 | Storino et al. ................ | 326/98 |
| 6,441,646 B1 | * 8/2002 | Braceras et al. .............. | 326/98 |

\* cited by examiner

*Primary Examiner*—Don Le
(74) *Attorney, Agent, or Firm*—Schwegman, Lundberg, Woessner & Kluth, P.A.

(57) ABSTRACT

A technique to individually adjust noise immunity of each input of a dynamic circuit including parallel or series-parallel pull-down network includes identifying precharge nodes of the dynamic circuit that require a reduction of noise. The technique further includes identifying NMOS transistor drains connected to respective precharge nodes, and creating a pull-up network of PMOS transistors for the identified precharge nodes. After creating a pull-up network of PMOS transistors, the technique includes arranging the order of the PMOS transistors corresponding to the respective precharge nodes to improve noise immunity and performance of the dynamic circuit. After arranging the order of the PMOS transistors, the technique can further include sizing the PMOS transistors to achieve the required reduction of noise for the precharge nodes.

32 Claims, 7 Drawing Sheets

DYNAMIC CMOS CIRCUITS WITH INDIVIDUALLY ADJUSTABLE NOISE IMMUNITY

This application is a divisional of application U.S. Ser. No. 09/607,495, filed on Jun. 30, 2000 is now a U.S. Pat. No. 6,518,796.

TECHNICAL FIELD

This subject matter relates generally to dynamic circuits and, more particularly, to noise immunity of dynamic circuits.

BACKGROUND

Dynamic logic circuits are well-known in the semiconductor data processing art. Basically, dynamic circuits require a two-phase operation. In a first phase, an output of a dynamic circuit is precharged, and in a second phase the output of the dynamic circuit is evaluated. While such dynamic circuits provide quick operation with lower power consumption than their static counterparts, dynamic circuits are particularly susceptible to noise in an input signal. Such noise can include ground bounce, crosstalk, charge sharing, process variations, charge leakage, alpha particles, electromagnetic radiation or other such unwanted electrical signals which occur within the circuit, resulting in spurious signals occurring at an output of a dynamic circuit. With dynamic circuits, in particular, such noise in an input signal may cause a precharged node therein to discharge, and an erroneous output signal will be produced when the noise rises above the threshold voltage of the transistors in the dynamic circuit.

As power supply voltages ($V_{cc}$) are scaled down, the transistor threshold voltages ($V_{th}$) also need to be reduced in order to preserve circuit performance. Generally, the trade-off for low-voltage circuits is between noise margins and performance. Also, generally the noise margin of dynamic circuits is directly related to $V_{th}$, and a reduction in threshold values results in a reduced noise margin, and this reduction in noise margin may not be acceptable. Present solutions to the noise problems in dynamic circuits fall generally into two classes, the first being increasing noise margins of all inputs in the same way, and the second being independently controlling noise margins of each individual input. Increasing the noise margin of all inputs can result in reduced performance, when only some of the inputs are noisy. Whereas independently controlling the noise margins of each input is generally a good trade-off for low voltage circuits in terms of performance, the present techniques for independently controlling the noise margins of each input are generally applicable to only special type of circuits such as AND gates (dynamic circuits including series pull-down network).

For the reasons stated above, and for other reasons stated below which will become apparent to those skilled in the art upon reading and understanding the present specification, there is a need in the data processing art for independently controlling the noise margins of each input in a dynamic circuit. This is especially needed in a dynamic circuit including a parallel or series-parallel pull-down network (such as OR and ANDOR gates) which has improved noise immunity that is not dependent on the type of circuitry (such as AND, OR, and ANDOR gates), and can generally work on all types of dynamic circuits.

DETAILED DESCRIPTION

Figure 1A:
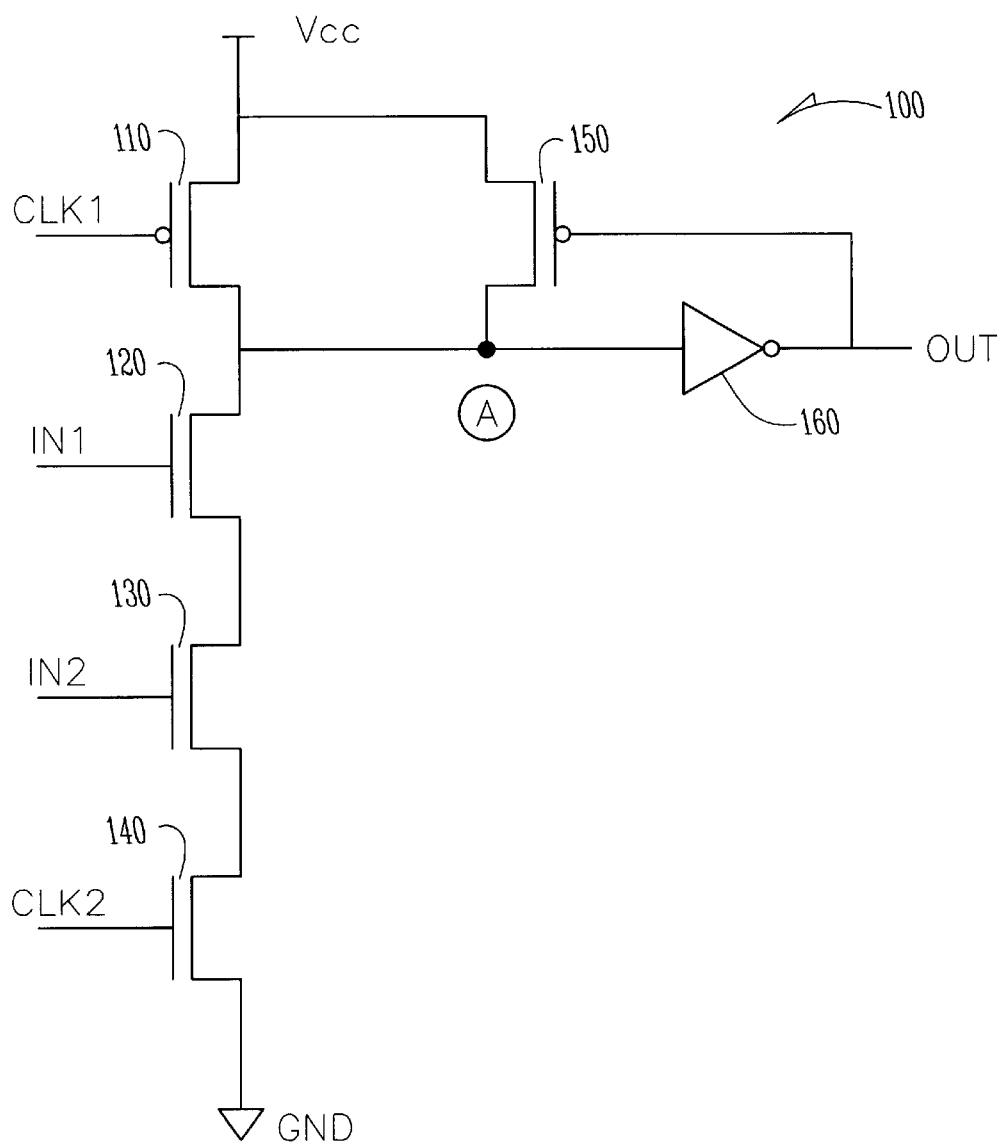
FIG. 1A illustrates a prior art solution for noise, in circuit form, for a domino circuit.

In the following detailed description of the embodiments, reference is made to the accompanying drawings that illustrate embodiments of the present invention and their practice. In the drawings, like numerals describe substantially similar components throughout the several views. These embodiments are described in sufficient detail to enable those skilled in the art to practice them. Other embodiments may be utilized, and structural, logical, and electrical changes may be made without departing from the scope of the present disclosure. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of embodiments of the present invention is defined only by the appended claims, along with the full scope of equivalents to which such claims are entitled.

This document describes, among other things, a system of individually adjusting a noise immunity of each of the inputs of a dynamic circuit.

FIG. 1A is a circuit diagram of the prior art illustrating generally, a prior art domino (domino circuits are generally circuits having a dynamic part followed by a static part and an inverter) with keeper circuit 100. As shown in FIG. 1A, domino with keeper circuit 100 includes a first transistor 110, a second transistor 120, a third transistor 130, a fourth transistor 140, a fifth transistor 150, and an inverter 160. A first electrode of the first transistor 110 is coupled to $V_{cc}$. A first clock signal (CLK1) is coupled to a control input of first transistor 110. A first electrode of the fifth transistor 150 is coupled to $V_{cc}$. A second electrode of the fifth transistor 150 and a second electrode of the first transistor 110 are coupled to an input of inverter 160. A first electrode of the second transistor 120 is coupled to the second electrode of the first transistor 110. A control input of the second transistor 120 is connected to an input signal (IN1). A first electrode of the third transistor 130 is connected to a second electrode of the second transistor 120. A control electrode of the third transistor 130 is connected to an input signal (IN2). A first electrode of the fourth transistor 140 is connected to a second electrode of the third transistor 130. A control electrode of the fourth transistor 140 is connected to a second clock signal (CLK2). A second electrode of the fourth transistor 140 is connected to Ground (GND). In some embodiments, the fourth transistor 140 (generally known as a "foot" transistor) may not be needed, when one of the inputs IN1 and IN2 is connected to another dynamic circuit such as a domino circuit.

In this prior art domino with keeper circuit 100, a node labeled "A" is precharged to a logic high value during a first phase of a clock signal. As the clock signal goes to a logic low level, transistor 110 begins conducting and precharges node "A" to a predetermined voltage value. For example, after a next rising edge of the clock signal, and when one of the input signals IN1 and IN2 is high (when one of the inputs IN1 and IN2 is high, the clock input CLK2 will also be high during the evaluation phase), and when one of the other input signals IN1 and IN2 is low, and a noise is introduced in the input signal having a low signal which rises above the threshold voltage of the transistor corresponding to the low signal, the transistor will be enabled, along with the transistor with the high signal, to conduct current such that node "A" is pulled to a low logic level. Generally, threshold voltage in a dynamic circuit is around 15% of a supply voltage, and noise introduced in one of the input signals IN1 and IN2 may often exceed the threshold voltage. In this case, the dynamic logic circuit has an increased sensitivity to noise which can result in the logic circuit providing an erroneous output. Newer technologies are using lower voltage power supplies, which necessitates the need for using lower threshold voltages in dynamic circuits. Also, due to process variations in various manufacturing phases of a circuit, the threshold voltage may in fact be even lower than 15% of supply voltage of the power supply.

Figure 1B:
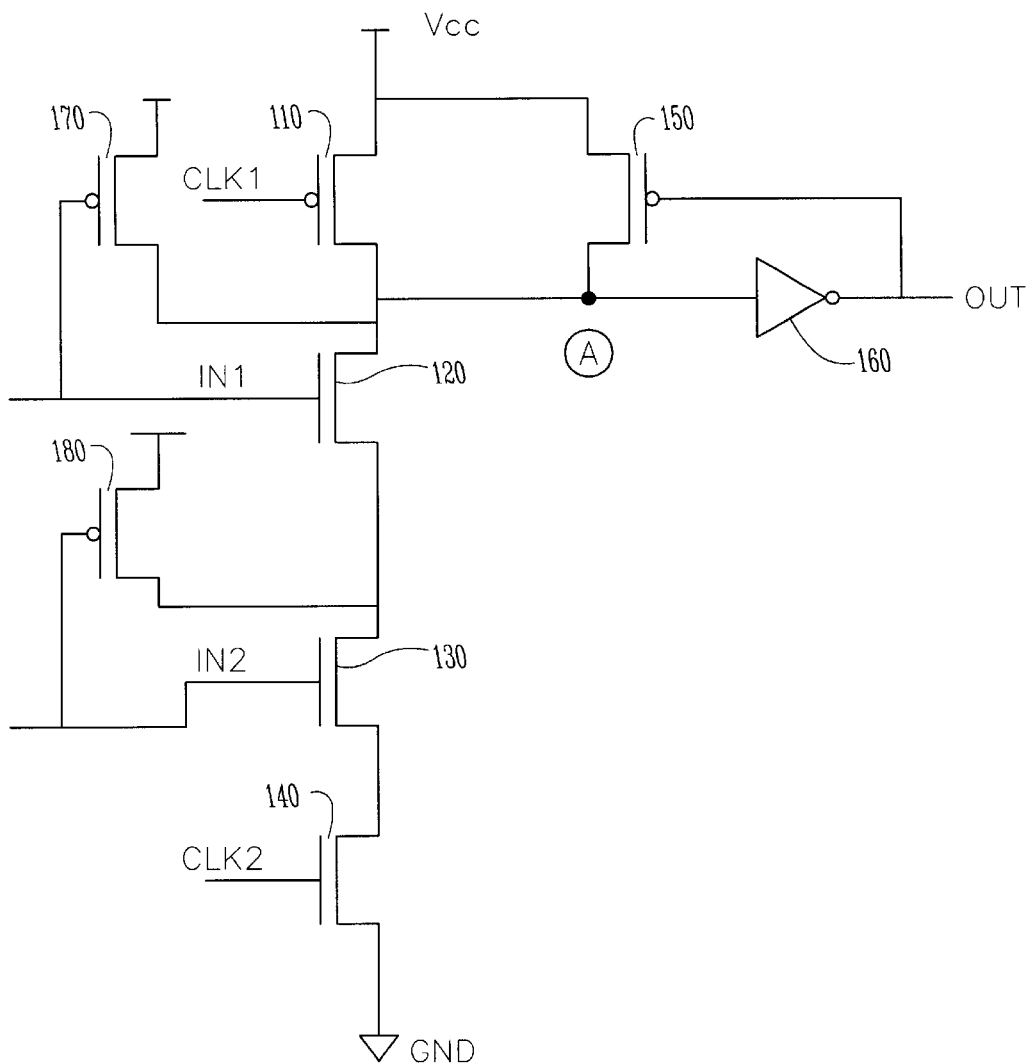
FIG. 1B illustrates a prior art solution for independently selecting noise margins for each input, in circuit form, for the domino circuit shown in FIG. 1A.

FIG. 1B is a circuit diagram (AND gate) of the prior art, similar to FIG. 1A, illustrating generally a prior art solution for independently controlling noise margins for each of the inputs IN1 and IN2. In addition to what is shown in FIG. 1A, FIG. 1B includes first and second PMOS transistors 170 and 180 coupled to first and second NMOS transistors 120 and 130, respectively. A node labeled "A" is precharged to a logic high value during a first phase of a clock signal. As the clock signal goes to a logic low level, transistor 150 begins conducting and precharges the node "A" to a predetermined voltage value. If, after a next rising edge of the clock signal, and when one of the two input signals IN1 and IN2 is high, and a noise is introduced in the other of the two input signals IN1 and IN2, the output will not be discharged, because when the noise is introduced in the other of the two input signals IN1 and IN2, the current, instead of coming from precharge node "A", comes from respective PMOS transistors 170 and 180. For example, if after a next rising edge of the clock signal, IN2 is high, and IN1 is low, then first PMOS transistor 170 is on, and the second transistor (NMOS transistor) 120 is off. If we introduce noise in input IN1, the first PMOS transistor 170 will still be on, the second transistor 120 will turn on, and the precharge node "A" will not be discharged, because all of the current passing through the second transistor 120 comes from $V_{cc}$ through the first PMOS transistor 170. Precharge node "A" will be discharged only when threshold values of both the pull-down and pull-up circuits are crossed. Therefore, by including the first and second PMOS transistors 170 and 180, respectively in the pull-up network, node "A" will be discharged only after the threshold values of both the pull-down and pull-up circuits are crossed.

Figure 2:
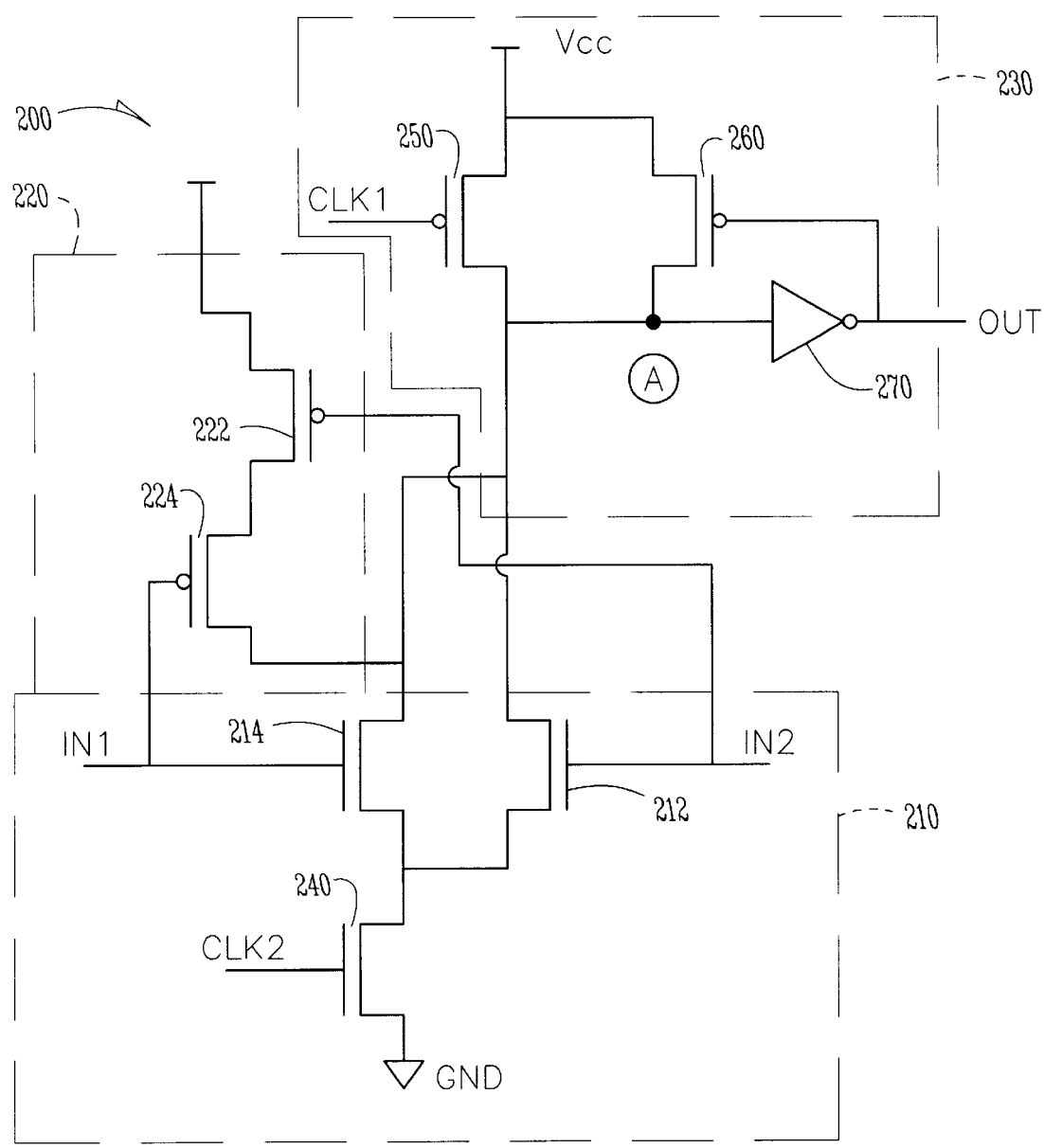
FIG. 2 illustrates a solution according to one embodiment of the present subject matter, in circuit form, for an OR gate.

FIG. 2 is a circuit diagram of a domino with keeper circuit 200 (OR gate) according to an embodiment of the present invention. The domino with keeper circuit 200 shown in FIG. 2 comprises an NMOS circuit 210 having a first NMOS transistor 214 and a second NMOS transistor 212. Further, the domino with keeper circuit 200 comprises a PMOS circuit 220 having a first PMOS transistor 224 and a second PMOS transistor 222 coupled to the first and second NMOS transistors 214 and 212, respectively. NMOS circuit 210 is further coupled to a first clock transistor 240. The domino with keeper circuit 200 further comprises a precharge circuit 230 having a second clock transistor 250 and a keeper transistor 260 coupled to an inverter 270.

In the domino with keeper circuit 200 shown in FIG. 2, a node labeled "A" is precharged to a logic high value during a first phase of a clock signal. As the clock signal goes to a logic low level, transistor 250 begins conducting and precharges node "A" to a predetermined voltage value. If, after a next rising edge of the clock signal, and when both the input signals IN1 and IN2 are low, and a noise is introduced in any one of the input signals IN1 and IN2, the output will not be discharged, due to the presence of the PMOS circuit 220 (PMOS pull-up stack). The output will be discharged only after the threshold values of the pull-down and pull-up circuits are crossed, i.e., the current sinked by the pull-down becomes larger than the current sourced by the pull-up circuits. For example, assume that after the next rising of the clock signal, IN1 and IN2 are low, the first and second PMOS transistors 224 and 222 are on, and the first and second NMOS transistors 214 and 212 are off. If we introduce a noise signal in either of the inputs IN1 and IN2, the first and second PMOS transistors 224 and 222 will still be on, then the first and second NMOS transistors 214 and 212 will be turned on, and precharge node "A" will not be discharged, because all of the current passing through either of the first and second NMOS transistors 214 and 212 will come from $V_{cc}$ through either one of the first and second PMOS transistors 224 and 222, respectively. Precharge node "A" will be discharged only when the threshold values of both the pull-down (including the first and second NMOS transistors 214 and 212) and pull-up circuits (including the first and second PMOS transistors 224 and 222) are crossed.

The noise margin of each input IN1 and IN2 can be individually controlled by changing a ratio of the PMOS transistor to the corresponding NMOS transistor, respectively. In one embodiment, the ratio of PMOS transistors to corresponding NMOS transistors is determined using a simulation technique. The PMOS transistors of the pull-up stack can be omitted for inputs having a noise margin lower than a threshold voltage.

Figure 3:
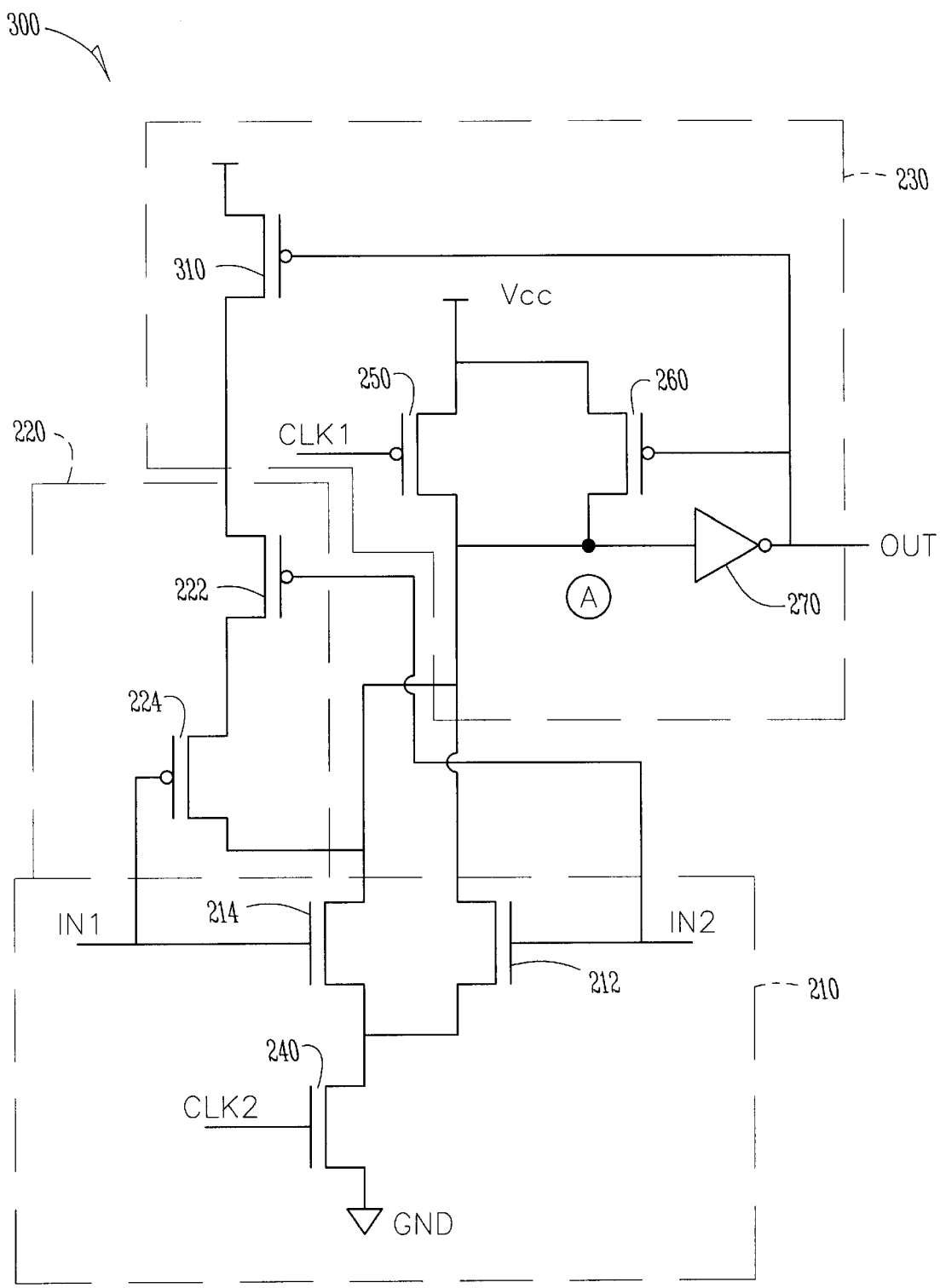
FIG. 3 illustrates a solution according to one embodiment of the present subject matter, in circuit form, for an OR gate including a cut-off PMOS transistor.

FIG. 3 is a circuit diagram, similar to FIG. 2, of a domino with keeper circuit 300 according to another embodiment of the present invention. In addition to what is described in FIG. 2, FIG. 3 includes a cut-off PMOS transistor 310 between inverter 270 and the second PMOS transistor 222. As shown in FIG. 3, the cut-off PMOS transistor 310 turns off the stack of PMOS transistors 224 and 222 after an evaluation phase, to prevent unintentional activation of the stack of PMOS transistors, when the domino with keeper circuit inputs are not truly dynamic and are not going back to a zero during the evaluation phase.

Figure 4:
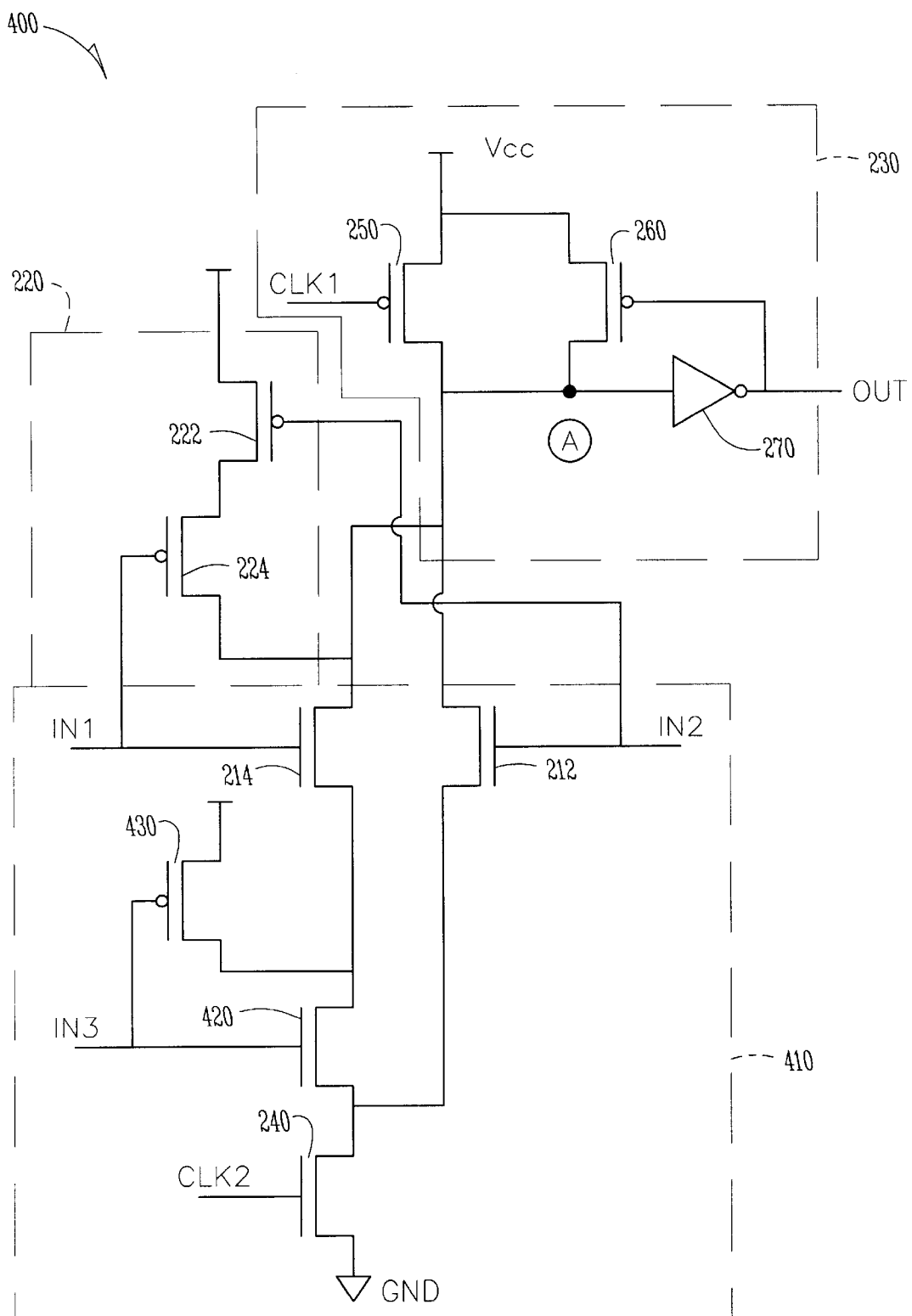
FIG. 4 illustrates a solution according to one embodiment of the present subject matter, in circuit form, for an ANDOR gate.

FIG. 4 is a circuit diagram, similar to FIG. 2, of an ANDOR gate circuitry 400 according to another embodiment of the present invention. In addition to the first and second NMOS transistors 214 and 212 in the NMOS circuit 210 shown in FIG. 2, NMOS circuit 410 shown in FIG. 4 further includes a third NMOS transistor 420 and a third PMOS transistor 430. A first electrode of the third NMOS transistor 420 is coupled to the second electrode of the first clock transistor 240. A second electrode of the third NMOS transistor 420 is coupled to the first electrode of first NMOS transistor 224. A control electrode of the third NMOS transistor 420 is coupled to an input signal (IN3). A first electrode of the third PMOS transistor 430 is coupled to the second electrode of the third NMOS transistor 420. A second electrode of the third PMOS transistor 430 is coupled to a pull-up circuit. A control electrode of the third PMOS transistor 430 is coupled to the control electrode of the third NMOS transistor 420.

In this ANDOR gate circuit 400, a node labeled "A" is precharged to a logic high value during a first phase of a clock signal. As the clock signal goes to a logic low level, transistor 250 begins conducting and precharges the node "A" to a predetermined voltage value. If, after a next rising edge of the clock signal, and when one of the input signals IN1 and IN3 is high, and the other is low, and also the input signal IN2 is low, and a noise is introduced in the input signals having the low signal, the output will not be discharged because the PMOS circuit 220 (PMOS pull-up stack) is present. The output will be discharged only after the threshold values of the pull-down and pull-up circuits are crossed, i.e., the current sinked by the pull-down becomes larger than the current sourced by the pull-up. The noise margin of each input IN1, IN2, and IN3 can be individually controlled by changing a ratio of a PMOS transistor to a corresponding NMOS transistor, respectively. The PMOS transistors 224 and 222 of the pull-up stack can be omitted for inputs having a noise margin lower than the threshold voltage.

Figure 5:
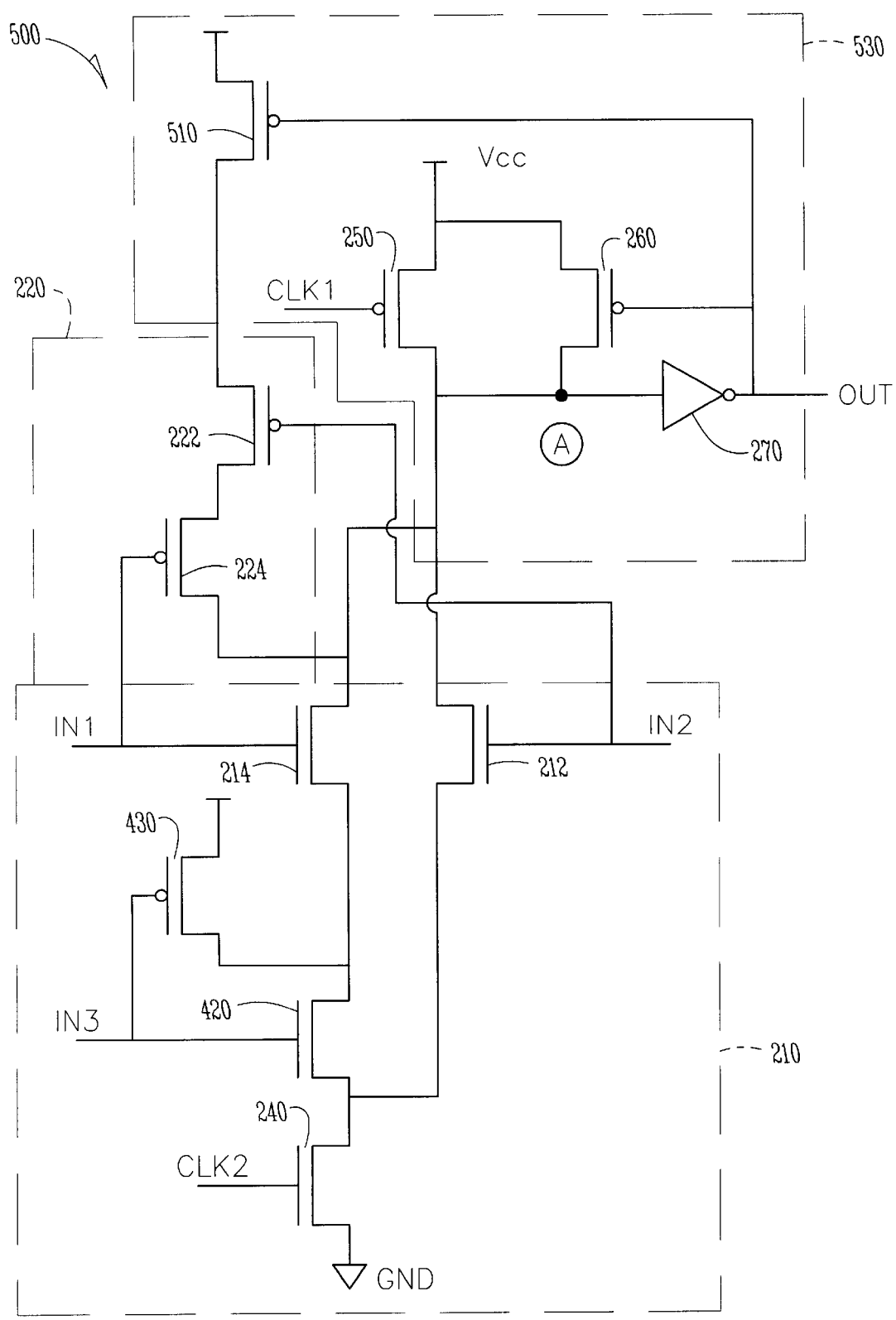
FIG. 5 illustrates a solution according to one embodiment of the present subject matter, in circuit form, for an ANDOR gate including a cut-off PMOS transistor.

FIG. 5 is a circuit diagram, similar to FIG. 4, of an ANDOR gate circuitry 500 according to another embodiment of the present invention. In addition to what is shown in FIG. 2, FIG. 3 includes a cut-off PMOS transistor 510 between the inverter 270 and the second PMOS transistor 222 to turn off the stack of first, second, and third PMOS transistors 224, 222 and 420 after an evaluation phase to prevent an accidental activation of the stack of PMOS transistors when the ANDOR circuit inputs are not truly dynamic and are not going back to a zero during the evaluation phase.

Figure 6:
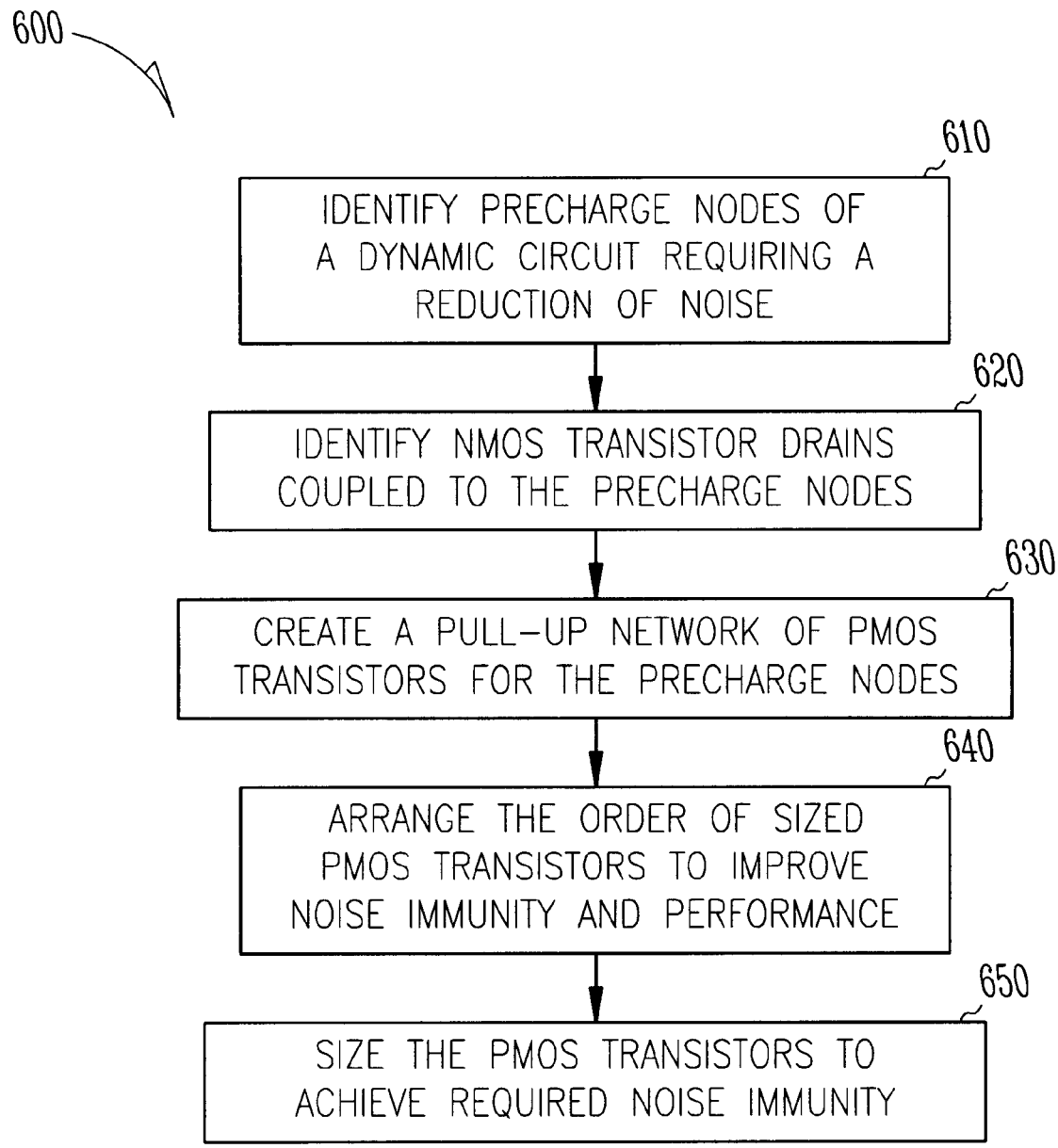
FIG. 6 is a flow diagram of one embodiment of the present invention.

FIG. 6 is a flow diagram, illustrating generally a method 600 of individually adjusting noise immunity of each input of a dynamic circuit including parallel or series-parallel pull-down networks to improve noise immunity and performance. Method 600 begins with action 610 by identifying precharge nodes of a dynamic circuit requiring a reduction of noise, including any output nodes. In one embodiment, the action of identifying precharge nodes that require reduction of noise is accomplished by using simulation techniques.

The next action 620 in the method 600 can include identifying NMOS transistor drains connected to respective identified precharge nodes, excluding any precharge transistors.

The next action 630 in the method 600 can include constructing a pull-up network of transistors for identified precharge nodes, respectively. In one embodiment, the pull-up network of transistors is formed using a stack of PMOS transistors such that the gates of the stack of PMOS transistors are connected to gates of corresponding NMOS transistor drains, respectively.

The next action 640 in the method 600 can include arranging the order of PMOS transistors corresponding to respective precharge nodes to further improve noise immunity and performance of the dynamic circuit. In general, the body effect of the dynamic circuit can be used to improve noise immunity, by arranging PMOS transistors in a stack such that the ones corresponding to a lower noise margin are placed closer to $V_{cc}$ and the ones corresponding to a higher noise margin are placed closer to the internal node.

The next action 650 in the method 600 includes sizing the PMOS transistors of the pull-up network to achieve a required reduction of noise for the identified precharge nodes, respectively. Typically, a larger PMOS transistor provides a higher noise immunity but a lower performance, and a smaller PMOS transistor provides a lower noise immunity but a higher performance. In one embodiment, the sizing of the PMOS transistors includes using a simulation technique to determine (to fine tune and optimize) the size of the PMOS transistors. In general, there will be some unwanted correlation among the noise margins of the inputs connected to the same stack of PMOS transistors, but this correlation can be determined by simulating the design and compensating for unwanted correlation by resizing individual PMOS transistors. The overall increase in noise margins is going to be lower than when no stacks of PMOS transistors are present, because of the larger equivalent "resistance" of stacked PMOS transistors, and because of the body effect on PMOS transistors not connected to the power supply. Both of these result in a lower pull-up current for a given noise. The size of the PMOS transistors can be increased to improve noise margins, and simulations can be used to fine-tune such sizing of the PMOS transistors.

The above technique can be generally applied to all types of dynamic circuits excepting circuits having pass-transistors for which the role of the source and drain changes depend on the direction of current flow. The present invention achieves noise immunity by providing a pull-up current to compensate for the pull-down current of a transistor with a noisy input. If the noise is larger than a threshold voltage $V_{th}$, the NMOS transistor will turn on and start discharging the precharging node in the absence of a pull-up stack of PMOS transistors. If a PMOS pull-up stack is present, the output will only be discharged after the switching threshold values of the pull-down and pull-up networks are crossed (the current sinked by the pull-down becomes larger than the current sourced by the pull-up). Using this technique, the noise margin of each individual input of a dynamic circuit can be controlled by changing the ratio of a PMOS transistor to the corresponding NMOS transistor.

In one embodiment, the technique further includes turning off the stack of series of PMOS transistors after an evaluation phase. Turning off the stack of series of PMOS transistors is generally necessary when the dynamic circuit inputs are truly dynamic and the input voltages do not go back to zero in the evaluation phase (this can activate the pull-up PMOS stack).

Conclusion

The above-described dynamic circuit provides, among other things, a technique to independently control noise margins of each input in a dynamic circuit to improve noise immunity and performance of the dynamic circuit. This technique enables one to achieve the highest possible performance in a dynamic circuit by controlling noise immunity of each input of the dynamic circuit based on the needs of each input. Also, embodiments of the present invention allow for individual control of the noise margin of each input for most types of dynamic circuits, with only a small performance penalty.

It is to be understood that the above description is intended to be illustrative and not restrictive. Many other embodiments will be apparent to those of skill in the art upon reviewing the above description. The scope of embodiments of the invention should, therefore, be determined with reference to the appended claims, along with the full scope of equivalents to which such claims are entitled.

What is claimed is:

1. A dynamic circuit, comprising:
at least one precharge node, to receive an electrical charge, wherein the at least one precharge node is to precharge to a precharged state having a precharge voltage and is to output the electrical charge;
a precharge circuit, coupled to the at least one precharge node, to provide the electrical charge;
a first clock transistor, coupled to the precharge circuit, to couple to a clock signal and to provide a conductive path for the electrical charge. wherein the first clock transistor is a PMOS transistor; and
a PMOS circuit, coupled to the precharge circuit, to provide a pull-up current to compensate for a pull-down current of the precharge circuit when coupled to at least one noisy input.

2. The dynamic circuit of claim 1, wherein the precharge circuit further comprises:
a second clock transistor having a first electrode to couple to a power source $V_{cc}$, a second electrode to couple to the at least one noisy input, and a control electrode to couple to an associated clock signal;
a keeper transistor having a first electrode to couple to the power source, a second electrode coupled to the precharge node, and a control electrode; and
an inverter having an input coupled to the at least one precharge node, and an output coupled to the control electrode of the keeper transistor, to provide an output signal based on the electrical charge outputted from the precharge node.

3. The dynamic circuit of claim 2, wherein the at least one noisy input comprises:
a first NMOS transistor having a first electrode, a second electrode coupled to the second electrode of the second clock transistor, and a control electrode to couple to a first noisy input (IN1);
a first clock transistor having a first electrode to couple to ground (GND), a second electrode coupled to the first electrode of the first NMOS transistor, and a control electrode to couple to the clock signal; and
a second NMOS transistor having a first electrode coupled to the second electrode of the first clock transistor, a second electrode coupled to a second electrode of the second clock transistor, and a control electrode to couple to a second noisy input (IN2).

4. The dynamic circuit of claim 3, wherein the PMOS circuit further comprises:
a first PMOS transistor having a first electrode coupled to the second electrode of the first NMOS transistor, a second electrode, and a control electrode coupled to the control electrode of the first NMOS transistor; and
a second PMOS transistor having a first electrode coupled to the second electrode of the first PMOS transistor, a second electrode coupled to a pull-up circuit, and a control electrode coupled to a control electrode of the second NMOS transistor.

5. The dynamic circuit of claim 4, wherein the precharge circuit further comprises a cut-off PMOS transistor having a first electrode coupled to the second electrode of the second PMOS transistor, a second electrode coupled to the pull-up circuit, and a control electrode coupled to the output of the inverter.

6. A dynamic circuit, comprising:
at least one precharge node, to receive an electrical charge, wherein the at least one precharge node is to precharge to a precharged state having a precharge voltage and is to output the electrical charge;
a precharge circuit, coupled to the at least one precharge node, to provide the electrical charge;
a first clock transistor, coupled to the precharge circuit, to provide a conduction path for the electrical charge outputted from the at least one precharge node, the first clock transistor comprising a first electrode to couple to a ground (GND), a second electrode, and a control electrode to couple to a first clock signal; and
a PMOS circuit, coupled to the precharge circuit, to provide a pull-up current to compensate for a pull-down current of the precharge circuit when coupled to at least one noisy input, wherein the at least one noisy input comprises:
a second clock transistor comprising a first electrode to couple to a power source $V_{cc}$, a second electrode, and a control electrode to couple to a second clock signal;
a first NMOS transistor having a first electrode, a second electrode coupled to the precharge circuit, and a control electrode to couple to a first noisy input (IN1);
a second NMOS transistor having a first electrode, a second electrode coupled to the second electrode of the second clock transistor, and a control electrode to couple to a second noisy input (IN2); and
a third NMOS transistor having a first electrode coupled to the second electrode of the first clock transistor, a second electrode coupled to the first electrode of the first NMOS transistor, and a control electrode to couple to a third noisy input (IN3).

7. The dynamic circuit of claim 6, wherein the PMOS circuit further comprises:
a first PMOS transistor having a first electrode coupled to the second electrode of the first NMOS transistor, a second electrode, and a control electrode coupled to the control electrode of the first NMOS transistor;
a second PMOS transistor having a first electrode coupled to the second electrode of the first PMOS transistor, a second electrode coupled to a pull-up circuit, and a control electrode coupled to the control electrode of the second NMOS transistor; and
a third PMOS transistor having a first electrode coupled to the second electrode of the third NMOS transistor, a second electrode coupled to the pull-up circuit, and a control electrode coupled to the control electrode of the third NMOS transistor.

8. The dynamic circuit of claim 7, wherein the precharge circuit further comprises:
a keeper transistor having a first electrode to couple to $V_{cc}$, a second electrode coupled to the precharge node, and a control electrode;
an inverter having an input coupled to the at least one precharge node, and an output coupled to the control electrode of the keeper transistor, to provide an output signal based on the electrical charge outputted from the precharge node; and
a cut-off PMOS transistor having a first electrode coupled to the second electrode of the second PMOS transistor, a second electrode coupled to the pull-up circuit, and a control electrode coupled to the output of the inverter.

9. A circuit comprising:
a first clock transistor coupled between a power supply voltage node and a precharge node;

first and second NMOS transistors coupled between the precharge node and the first clock transistor;

a second clock transistor coupled between the first and second NMOS transistors and a ground node; and first and second PMOS transistors coupled between the precharge node and the power supply voltage node.

10. The circuit of claim 9, wherein the first and second PMOS transistors comprise first and second control electrodes to couple to first and second noisy input signals, respectively, and wherein the first and second NMOS transistors comprise first and second control electrodes to couple to the first and second noisy input signals, respectively.

11. The circuit of claim 9, further comprising:

an inverter comprising an input coupled to the precharge node and comprising an output;

a keeper transistor coupled between the precharge node and the power supply voltage node and comprising a control electrode coupled to the output of the inverter.

12. The circuit of claim 11, wherein the keeper transistor comprises a PMOS transistor.

13. The circuit of claim 11, further comprising:

a cut-off PMOS transistor coupled between the second PMOS transistors and the power supply voltage node, wherein the cut-off PMOS transistor comprises a control electrode coupled to the control electrode of the keeper transistor and to the output of the inverter.

14. A dynamic CMOS circuit comprising:

a first clock transistor coupled between a power supply voltage node and a precharge node;

first, second, and third NMOS transistors coupled between the precharge node and the first clock transistor;

a second clock transistor coupled between the first, second, and third NMOS transistors and a ground node;

first and second PMOS transistors coupled between the precharge node and the power supply voltage node; and a third PMOS transistor coupled between the power supply voltage node and the first, second, and third NMOS transistors.

15. The circuit of claim 14, further comprising control electrodes of the first, second, and third PMOS transistors coupled to input signal nodes of the first, second, and third NMOS transistors, respectively.

16. The circuit of claim 14, further comprising a cut-off PMOS transistor coupled between the power supply voltage node and the second PMOS transistor.

17. The circuit of claim 14, further comprising:

an inverter coupled to the precharge node and comprising an output; and a keeper transistor, coupled between the precharge node and the power supply voltage node, and comprising a control electrode coupled to the output of the inverter.

18. The circuit of claim 17, wherein the cut-off PMOS transistor comprises a control electrode coupled to the control electrode of the keeper transistor and to the output of the inverter.

19. The circuit of claim 17, wherein the keeper transistor comprises a PMOS transistor.

20. A domino with keeper circuit comprising:

a first clock transistor comprising first and second electrodes, wherein the first electrode of the first clock transistor is to couple to a voltage supply and the second electrode of the first clock transistor is coupled to a precharge node;

first, second, and third NMOS transistors coupled between the precharge node and the second electrode of the first clock transistor;

a second clock transistor comprising first and second electrodes, wherein the first electrode of the second clock transistor is coupled to the first, second, and third NMOS transistors and the second electrode of the second clock transistor is to couple to ground;

first and second PMOS transistors coupled between the precharge node and the voltage supply;

a third PMOS transistor coupled between the first, second, and third NMOS transistors and the voltage supply;

control electrodes of the first and second clock transistors to couple to associated first and second clock signals; and control electrodes of the first, second, and third PMOS transistors to couple to associated control electrodes of the first, second, and third NMOS transistors, wherein respective control electrodes of the first, second, and third PMOS and NMOS transistors are to couple to corresponding noisy input signals.

21. The circuit of claim 20 further comprising:

a cut-off PMOS transistor comprising first and second electrodes and a control electrode, wherein the first electrode of the cut-off PMOS transistor is the couple to the voltage supply, and wherein the second electrode of the cut-off PMOS transistor is coupled to the second PMOS transistor.

22. The circuit of claim 21, further comprising:

an inverter coupled to the precharge node and having an output; and a keeper transistor, wherein the keeper transistor is a PMOS transistor having first and second electrodes and a control electrode, wherein the first electrode of the keeper transistor is to couple to the voltage supply and the second electrode of the keeper transistor is coupled to the precharge node, wherein the control electrode of the keeper transistor is coupled to the output of the inverter, and wherein the control electrode of the cut-off PMOS transistor is coupled to the control electrode of the keeper transistor.

23. A circuit comprising:

a first clock transistor comprising a PMOS transistor having first and second electrodes and a gate electrode, wherein the first electrode of the first clock transistor is to couple to a voltage supply and the second electrode of the first clock transistor is coupled to a precharge node;

first, second, and third NMOS transistors coupled between the precharge node and the second electrode of the first clock transistor;

a second clock transistor comprising an NMOS transistor having first and second electrodes and a gate electrode, wherein the first electrode of the second clock transistor is coupled to the first, second, and third NMOS transistors and the second electrode of the second clock transistor is to couple to a ground, wherein the gates of the first and second clock transistors are to couple to associated first and second clock signals;

first and second PMOS transistors coupled between the precharge node and the voltage supply; and a third PMOS transistor coupled between the first, second, and third NMOS transistors and the voltage supply.

24. The circuit of claim 23, further comprising control electrodes of the first, second, and third PMOS transistors coupled to associated input signal nodes of the first, second, and third NMOS transistors.

25. The circuit of claim 23, further comprising:

an inverter coupled to the precharge node and comprising an output; and a keeper transistor coupled between the precharge node and the voltage supply and comprising a control electrode coupled to the output of the inverter.

26. The circuit of claim 25, wherein the keeper transistor comprises a PMOS transistor.

27. The circuit of claim 25, further comprising a cut-off transistor coupled between the first and second PMOS transistors and the voltage supply, wherein the control electrode of the cut-off transistor is coupled to a control electrode of the keeper transistor and to the output of the inverter.

28. The circuit of claim 27, wherein the cut-off transistor comprises a PMOS transistor.

29. A dynamic circuit, comprising:

at least one precharge node, to receive an electrical charge, wherein the at least one precharge node is to precharge to a precharged state having a precharge voltage and is to output the electrical charge;

a precharge circuit, coupled to the at least one precharge node, to provide the electrical charge;

a first clock transistor, coupled to the precharge circuit, to couple to a clock signal and to provide a conductive path for the electrical charge;

a PMOS circuit, coupled to the precharge circuit, to provide a pull-up current to compensate for a pull-down current of the precharge circuit when coupled to at least one noisy input;

a second clock transistor having a first electrode to couple to a power source $V_{cc}$, a second electrode to couple to the at least one noisy input, and a control electrode to couple to an associated clock signal;

a keeper transistor having a first electrode to couple to the power source, a second electrode coupled to the precharge node, and a control electrode; and an inverter having an input coupled to the at least one precharge node, and an output coupled to the control electrode of the keeper transistor, to provide an output signal based on the electrical charge outputted from the precharge node.

30. The dynamic circuit of claim 29, wherein the at least one noisy input comprises:

a first NMOS transistor having a first electrode, a second electrode coupled to the second electrode of the second clock transistor, and a control electrode to couple to a first noisy input (IN1);

a first clock transistor having a first electrode to couple to ground (GND), a second electrode coupled to the first electrode of the first NMOS transistor, and a control electrode to couple to the clock signal; and a second NMOS transistor having a first electrode coupled to the second electrode of the first clock transistor, a second electrode coupled to a second electrode of the second clock transistor, and a control electrode to couple to a second noisy input (IN2).

31. The dynamic circuit of claim 30, wherein the PMOS circuit further comprises:

a first PMOS transistor having a first electrode coupled to the second electrode of the first NMOS transistor, a second electrode, and a control electrode coupled to the control electrode of the first NMOS transistor; and a second PMOS transistor having a first electrode coupled to the second electrode of the first PMOS transistor, a second electrode coupled to a pull-up circuit, and a control electrode coupled to a control electrode of the second NMOS transistor.

32. The dynamic circuit of claim 31, wherein the precharge circuit further comprises a cut-off PMOS transistor having a first electrode coupled to the second electrode of the second PMOS transistor, a second electrode coupled to the pull-up circuit, and a control electrode coupled to the output of the inverter.

* * * * *

UNITED STATES PATENT AND TRADEMARK OFFICE
CERTIFICATE OF CORRECTION

PATENT NO. : 6,710,627 B2
DATED : March 23, 2004
INVENTOR(S) : Stan et al.

It is certified that error appears in the above-identified patent and that said Letters Patent is hereby corrected as shown below:

Column 7,
Line 16, after "charge" delete "." and insert -- , --, therefor.

Column 10,
Line 23, after "is" delete "the" and insert -- to --, therefor.

Signed and Sealed this

Twenty-seventh Day of July, 2004

JON W. DUDAS
*Acting Director of the United States Patent and Trademark Office*